US007788616B2

(12) United States Patent
Baumgartner et al.

(10) Patent No.: US 7,788,616 B2
(45) Date of Patent: *Aug. 31, 2010

(54) METHOD AND SYSTEM FOR PERFORMING HEURISTIC CONSTRAINT SIMPLIFICATION

(75) Inventors: Jason R. Baumgartner, Austin, TX (US); Robert L. Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 354 days.

This patent is subject to a terminal disclaimer.

(21) Appl. No.: 11/940,755

(22) Filed: Nov. 15, 2007

(65) Prior Publication Data
US 2008/0066034 A1 Mar. 13, 2008

Related U.S. Application Data

(63) Continuation of application No. 11/232,764, filed on Sep. 22, 2005, now Pat. No. 7,315,996.

(51) Int. Cl.
*G06F 17/50* (2006.01)
(52) U.S. Cl. .................................... 716/5; 716/3; 716/4
(58) Field of Classification Search .................. 716/3, 716/4, 5, 18
See application file for complete search history.

(56) References Cited

U.S. PATENT DOCUMENTS

| 5,513,350 | A | 4/1996 | Griffin et al. |
| 5,606,695 | A | 2/1997 | Dworzecki |
| 6,836,877 | B1 | 12/2004 | Dupenloup |
| 7,315,996 | B2 | 1/2008 | Baumgartner et al. |
| 2004/0107174 | A1 | 6/2004 | Jones et al. |
| 2008/0066033 | A1 | 3/2008 | Baumgartner et al. |

OTHER PUBLICATIONS

Mony et al., "Exploiting Constraints in Transformation-Based Verification"; Correct Hardware Design and Verification Methods Conference; Oct. 3, 2005.
Mony, Hari, "Transformation-Based Verification"; Doctoral Dissertation Proposal; presented to the Electrical and Computer Engineering Committee at the University of Texas at Austin; Aug. 26, 2005; http://users.ece.utexas.edu.
Yuan et al., Constraints Synthesis for Environment Modeling in Functional Verification, DAC; 2003; pp. 296-299.

*Primary Examiner*—Sun J Lin
(74) *Attorney, Agent, or Firm*—Dillon & Yudell LLP

(57) ABSTRACT

A method for performing verification is disclosed. The method includes selecting a first computer-design constraint for simplification and applying structural reparamaterization to simplify the first computer-design constraint. In response to determining that the first computer-design constraint is not eliminated, the first computer-design constraint is set equal to a dead-end state of the constraint. A structural preimage of the first computer-design constraint is created, in response to determining that a combination of a target and the dead-end state of the first computer-design constraint is equal to a combination of the target and the structural preimage of the first computer-design constraint, the first computer-design constraint is set equal to the structural preimage.

6 Claims, 3 Drawing Sheets

METHOD AND SYSTEM FOR PERFORMING HEURISTIC CONSTRAINT SIMPLIFICATION

PRIORITY CLAIM

The present application is a continuation of U.S. patent application Ser. No. 11/232,764, now U.S. Pat. No. 7,315,996, filed Sep. 22, 2005, and entitled, "Method and System for Performing Heuristic Constraint Simplification," which is incorporated herein by reference.

BACKGROUND OF THE INVENTION

1. Field of the Invention

The present invention relates in general to verifying designs and in particular to verifying a logic function in a netlist. Still more particularly, the present invention relates to a system, method and computer program product for performing heuristic constraint simplification.

2. Description of the Related Art

With the increasing penetration of microprocessor-based systems into every facet of human activity, demands have increased on the microprocessor development and production community to produce systems that are free from data corruption. Microprocessors have become involved in the performance of a vast array of critical functions, and the involvement of microprocessors in the important tasks of daily life has heightened the expectation of reliability of calculative results. Whether the impact of errors would be measured in human lives or in mere dollars and cents, consumers of microprocessors have lost tolerance for error-prone results. Consumers will not tolerate, by way of example, miscalculations on the floor of the stock exchange, in the medical devices that support human life, or in the computers that control their automobiles. All of these activities represent areas where the need for reliable microprocessor results has risen to a mission-critical concern.

Formal verification techniques, semiformal verification techniques and simulation provide powerful tools for discovering errors and verifying the correctness of logic designs. Formal verification techniques, semiformal verification techniques and simulation frequently expose probabilistically uncommon scenarios that may result in a functional design failure. Additionally, formal verification techniques provide the opportunity to prove that a design is correct (e.g., that no failing scenario exists).

One commonly-used approach to formal, semiformal, and simulation analysis for applications operating on representations of circuit structures is to represent the underlying logical problem structurally (as a circuit graph), and to perform explicit or symbolic evaluation of that circuit graph.

In such an approach, a logical problem is represented structurally. Explicit simulation-based approaches to hardware verification are scalable to very large designs, though suffer from the coverage problem that generally limits them to yielding exponentially decreasing coverage with respect to design size. Formal verification techniques overcome the coverage problem of simulation, yielding exhaustive coverage, though suffer from computational complexity that limits their application to smaller designs.

Formal verification techniques generally require exponential resources with respect to the number of state elements and inputs of a design under verification. Various techniques have been proposed to address the reduction in the number of state elements. Constraints are often used in verification to prune the possible input stimulus in certain states of the design. For example, a constraint may state "if the design's buffer is full, then constrain the input stimulus to prevent new transfers into the design". Semantically, the verification tool will typically discard any states for which a constraint evaluates to a 0 (i.e., the verification tool may never produce a failing scenario showing a violation of some property of the design, if that scenario does not adhere to all the constraints for all time-steps prior to the failure). In this previous example, it would be illegal for the verification tool to produce a trace of length "i" showing a violation of some property, if that trace illustrated the scenario that the buffer was full and a new transfer was initiated into the design between time 0 and i (inclusive).

The modeling of design environments using constraints has gained widespread industrial application, and most verification languages include constructs for specifying constraints. It is therefore critical for verification tools to intelligently leverage constraints to enhance the overall verification process. Though constraints enable efficient modeling of design environments, they pose several challenges to transformation and verification algorithms. For example, transformation methods like retiming may be required to generate even a sub-optimal result in the presence of constraints. Redundancy removal methods are also restricted in their ability to simplify the cones of the constraints.

Constraints also pose challenges to testcase generation and explicit state analysis. Though constraint-preserving testcase generation for simulation has been widely researched, the prior art does not effectively solve the problem of the preservation of "dead-end constraints", which entail states for which there is no legal stimulus. Dead-end constraints tend to reduce the efficiency of explicit-state analysis, as well as semi-formal search; when a dead-end state is reached, the only recourse is to backtrack to an earlier state. No prior work has adequately addressed the simplification of dead-end constraints.

What is needed is an improved method for heuristic constraint simplification.

SUMMARY OF THE INVENTION

A method for performing verification is disclosed. The method includes selecting a first computer-design constraint for simplification and applying structural reparamaterization to simplify the first computer-design constraint. In response to determining that the first computer-design constraint is not eliminated, the first computer-design constraint is set equal to a dead-end state of the constraint. A structural preimage of the first computer-design constraint is created, in response to determining that a combination of a target and the dead-end state of the first computer-design constraint is equal to a combination of the target and the structural preimage of the first computer-design constraint, the first computer-design constraint is set equal to the structural preimage.

BRIEF DESCRIPTION OF THE DRAWINGS

The present invention is described in a preferred embodiment in the following description with reference to the drawings, in which like numbers represent the same or similar elements, as follows.

DETAILED DESCRIPTION OF A PREFERRED EMBODIMENT

The present invention provides a system, method and computer program product for performing heuristic constraint simplification. The constraint simplification method of the present invention provides a general approach to constraint simplification that is geared toward simplifying dead-end constraints and ultimately eliminating them from the verification problem (represented as a netlist). The present invention provides an efficient implementation for replacing a constraint with a preimage, heuristically trying to reduce the size of the constraint cone and enabling the elimination of the constraint through reparameterization.

The present invention is capable of yielding dramatic improvements to the verification of designs with dead-end constraints and its structural nature enables benefits to arbitrary frameworks, including testcase generation and synthesis. The approach of the present invention has proven very powerful in enhancing the verification of designs in the presence of constraints, via the implementation of this technique in verification tools.

Figure 1:
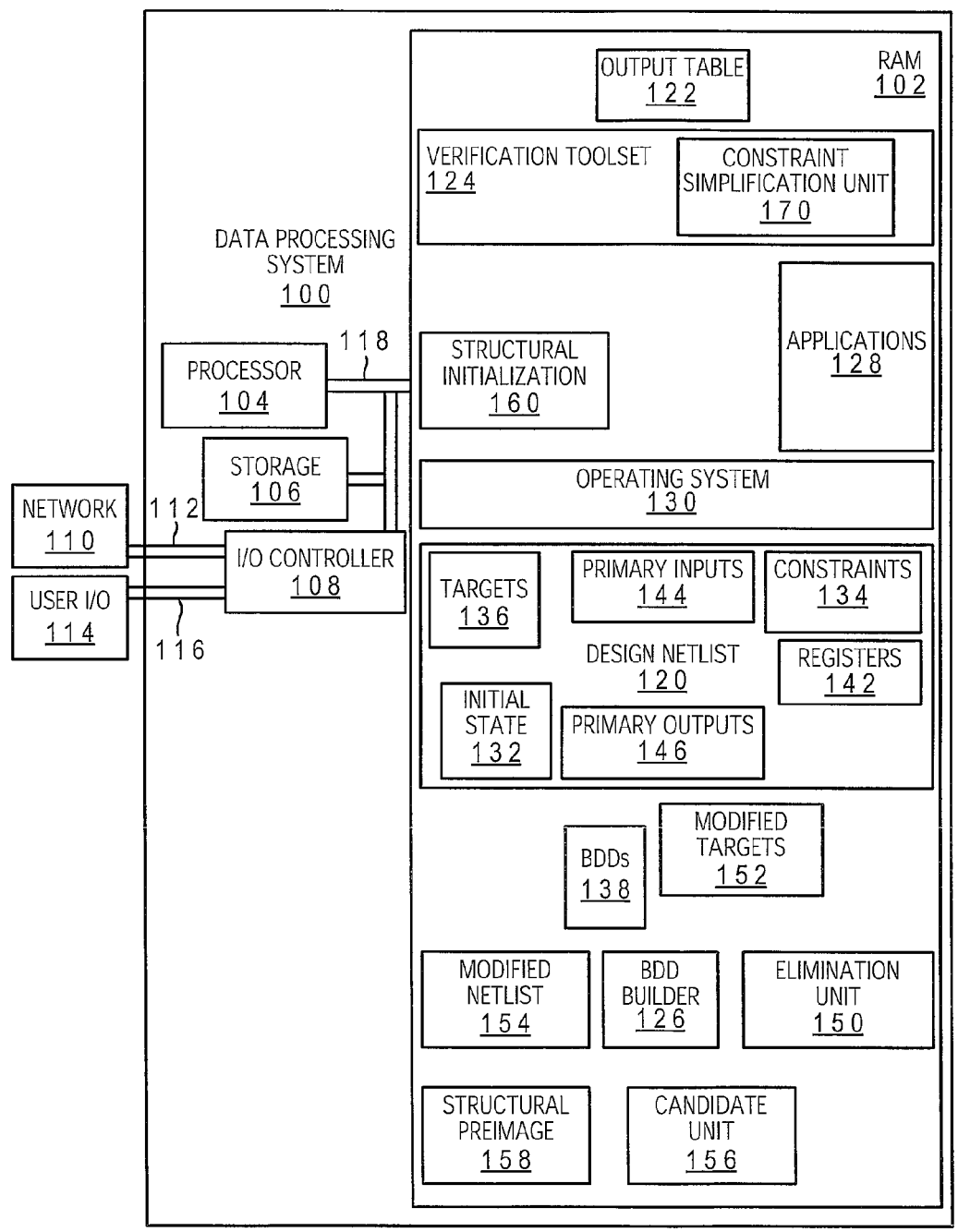
FIG. 1 illustrates a block diagram of a general-purpose data processing system with which the present invention of a system, method and computer program product for performing heuristic constraint simplification may be performed.

With reference now to the figures, and in particular with reference to FIG. 1, a block diagram of a general-purpose data processing system, in accordance with a preferred embodiment of the present invention is depicted. Data processing system 100 contains a processing storage unit (e.g., RAM 102) and a processor 104. Data processing system 100 also includes non-volatile storage 106 such as a hard disk drive or other direct-access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions while operating in accordance with a preferred embodiment of the present invention. These include a design netlist 120, a binary decision diagram (BDD) builder 126 for building binary decision diagrams (BDDs) 138 and an output table 122 for recording results from a verification toolset 124 containing a constraint simplification unit 170. Other applications 128 and verification toolset 124 interface with processor 104, RAM 102, I/O control 108, and storage 106 through operating system 130. While discussion of the present invention centers on BDD-based verification techniques, verification toolset 124 is capable of performing BDD or SAT based verification in the course of performing the present invention. The present invention can be used in any verification framework which performs verification using constraints on a netlist representation of a verification problem. One skilled in the data processing arts will quickly realize that additional components of data processing system 100 may be added to or substituted for those shown without departing from the scope of the present invention. Other data structures within RAM 102 include an elimination unit 150, modified targets 152, modified netlist 154, candidate unit 156, structural preimage 158, and a structural initialization 160.

A netlist graph, such as design netlist 120, is a popular means of compactly representing problems derived from circuit structures in computer-aided design of digital circuits. Such a representation is non-canonical and offers some ability to analyze the function from the nodes in the graph. A netlist contains a directed graph with vertices representing gates and edges representing interconnections between those gates. The gates have associated functions, such as constants, constraints 134, targets 136, an initial state 132 of the design, primary inputs 144, primary outputs 146, combinational logic (e.g., AND gates), and sequential elements (hereafter referred to as registers 142). Registers 142 have two associated components: their next-state functions and their initial-value functions, which are represented as other gates in the graph. Semantically, for a given register 142, the value appearing at its initial-value (from initial state 132) gate at time '0' ("initialization" or "reset" time) will be applied as the value of the register 142 itself; the value appearing at its next-state function gate at time "i" will be applied to the register itself at time "i+1".

Binary decision diagrams 138 are a popular choice for efficiently applying Boolean reasoning to problems derived from circuit structures, which are frequently represented in netlist graphs. Binary decision diagrams 138 offer a compact and canonical representation of the Boolean function of a graph node, which expedites reasoning regarding a node's function.

Processor 104 executes instructions from programs, often stored in RAM 102, in the course of performing the present invention. In a preferred embodiment of the present invention, processor 104 executes verification toolset 124. Verification toolset 124 creates binary decision diagrams 138 through the operation of binary decision diagram builder 126 on the circuit specifications contained in design netlist 120, which contains instructions for modeling a simulated item of logical hardware.

In a preferred embodiment, the present invention is applied to a design netlist 120 representation where the only combinational gate type is a 2-input AND, and inverters are represented implicitly as edge attributes.

Targets 136 represent nodes whose Boolean expressions are of interest and need to be computed. The goal of the verification process is to find a way to drive a '1' on a target node, or to prove that no such assertion of the target is possible. In the former case, a "counterexample trace" showing the sequence of assignments to the inputs in every cycle leading up to the fail event getting triggered is generated and recorded to output table 122.

Verification toolset 124 includes a computer program product, stored in RAM 102 and executed on processor 104, which provides a series of tools for activities such as equivalence checking, property checking, logic synthesis and false-paths analysis. Generally speaking, verification toolset 124 contains rule-based instructions for predicting the behavior of logically modeled items of hardware.

Verification toolset 124 uses the series of rules contained in its own instructions, in conjunction with design netlist 120, to represent the underlying logical problem structurally (as a circuit graph), and uses binary decision diagram builder 126 to construct binary decision diagrams 138, thereby converting the structural representation into a functionally canonical form. In a preferred embodiment, verification toolset 124 includes a Cycle-Based Symbolic Simulator (CBSS), which performs a cycle-by-cycle simulation on design netlist 120 symbolically by applying unique random, or non-deterministic, variables to the netlist inputs in every cycle.

Verification toolset 124 essentially performs forward BDD-based bounded symbolic simulation, starting from initial state 132. Verification toolset 124 extends the cycle simulation methodology to symbolic values. Verification toolset 124 applies symbolic functions to the inputs in every cycle and propagates them to the targets 136. At each step the Boolean expressions, represented as binary decision diagrams 138, corresponding to each node in design netlist 120 are computed until the expressions for all "sink" nodes, i.e. nodes labeled as primary outputs 146, targets 136, constraints 134 and next-state functions of registers 142, are obtained.

At each step of the simulation the Boolean expressions of the target 136 nodes are tested for being non-zero. If so, a counterexample trace leading up to the failure (represented by the assertion of the target node to a '1') is returned and reported to output table 122. If unsolved targets 136 remain, then the registers 142 are updated with the values, represented as binary decision diagrams 138, of the next-state functions, and the process continues. At every step of the verification process, there is a potential for a blow-up in memory when computing the binary decision diagrams 138 for any of the sink nodes.

Given a design netlist (N) 120 with target (t) 136 and constraint (c) 134, constraint (c) 134 can be "eliminated" by verification toolset 124 using elimination unit 150. Elimination unit 150 folds constraint (c) 134 into target (t) 136 using the method embodied by the following exemplary pseudocode:

```
Eliminate-Constraints(Netlist N)
    r = create-register;
    init-state(r) = 1;
    c' = c AND r;
    next-state(r) = c';
    prop_p(t,c) = t AND c';
    Label prop_p(t,c) as a target instead of t and remove constraint c
```

Note that the method above, used by elimination unit 150, enables "elimination" of some constraints 134 by folding them into the targets 136, performing a transformation such that modified targets 152, which are generated by elimination unit 150, will only be hittable along traces which hit the original target 136 while satisfying all constraints 134. However, this transformation itself tends to entail suboptimalities to the overall verification process. For example, simulation and semi-formal search tools within verification toolset 124 have difficulties identifying when they have entered into a "useless" part of the state-space, e.g., one in which a register (r) 142 evaluates to a 0 and a target 136 can never be subsequently hit. Constraints 134 therefore can be viewed as "invalidating" traces (0, 1 valuations to gates over time) at (and beyond) time-steps at which any constraint gate evaluates to a 0, a phenomenon referred to as the "trace-prefixing" effect of constraints 134. Also, it should be noted that redundancy removal techniques can sometimes leverage the constraints 134 to yield additional reductions of the design netlist 120. Eliminating tagging of constraint (c) 134 as a constraint 134, eliminates redundancy removal potential.

Constraint simplification unit 170, however, operates on the principle that, for a design netlist (N) 120 with constraint (c_1) 134 and gate (c_2), if, for all targets (t) 136, a prop_p(t, c_1) can be proven as equivalent to prop_p(t, c_2) without the trace-prefixing entailed by constraint (c_1) 134, then converting design netlist (N) 120 into a modified netlist (N') 154 by labeling gate (c_2) as a constraint 134 instead of (c_1) is a property preserving transformation. In certain cases, constraint simplification unit 170 will modify the gates of constraints 134 in a design netlist 120 while preserving property checking, shrinking the size of the cones of constraints 134 and thereby effectively strengthening their reduction potential. A candidate unit 156 automatically derives a candidate gate (c_2), which verification toolkit 124 attempts to utilize for replacing constraint (c_1) 134. The structural preimage 158 of a gate u which has no inputs in its combinational fanin, struct_pre(u), is a logic cone obtained by replacing each register gate v in the combinational fanin of gate u with its corresponding next-state function.

Candidate unit 156 operates under a method embodied by the following exemplary pseudocode:

```
while ( not done ) // Iterate until arbitrary termination criteria done
    Apply structural reparameterization [3] to simplify constraint c;
    If constraint c has been eliminated by reparameterization, break;
    // Else, note that c has been simplified to its dead-end states
    if ( prop_p(t,c) can be proven as equivalent to prop_p(t,
    struct_pre(c)))
        c = struct_pre(c);
    else break;
```

Constraint simplification unit 170 uses the heuristic constraint simplification method described above in attempting to iteratively simplify, and ultimately eliminate, constraints 134 in a property-preserving manner. At each iteration, verification toolkit 124 uses reparameterization to replace the current constraint (c) 134 with a constraint (c') 134 representing the dead-end states of constraint (c) 134. In other words, reparameterization will alter design netlist 120 to create modified netlist 154 in a way which attempts to reflect the constraining power of constraint (c) 134 over the primary inputs 144 in its combinational fanin cone using gates comprising a filter over the input space.

For example, assume that the design netlist 120 has a vector of inputs, and a constraint 134 that evaluates to a 1 only when that vector of inputs evaluates to even parity. Reparameterization will effectively inject gates onto those inputs so that the sink logic of those inputs will only witness valuations with even parity. Note that this step will eliminate the constraint 134 if the constraint 134 entails no dead-end states. However, if the design netlist 120 has registers 142 in its combinational fanin, reparameterization may be unable to completely eliminate a constraint 134. For example, assume that we have a constraint 134 of the form "i1 AND r1", for input (i1) and register (r1) 142. Reparameterization will ensure that sinks of (i1) will only see that input evaluate to a 1, but reparameterization will be unable to ensure that register (r1) 142 always evaluates to a 1. Reparameterization will thus replace the original constraint 134 with the dead-end states of the original constraint 134, computed by exists-inputs (f(c)), which existentially quantifies input variables from the function of the original constraint c 134. If the result is not equal to 1, the result represents the dead-end states associated with constraint (c) 134. In the foregoing example, verification toolset 124 existentially quantifies input (i1) from "(i1) AND register (r1) 142", resulting in dead-end states register (r1) 142. Thus, applying reparameterization during an iteration of the candidate unit 156 pseudocode above to a constraint 134 of the form "(i1) AND register (r1) 142" will replace that constraint 134 with register (r1) 142.

If the constraint 134 is not eliminated by reparameterization, constraint simplification unit 170 attempts to simplify the resulting dead-end constraint 134. The resulting dead-end constraint is a purely sequential function. The resulting dead-end constraint is replaced with its structural preimage 158. Constraint simplification unit 170 then validates that such a replacement preserves property checking on the basis of the principle that, for a design netlist (N) 120 with constraint (c_1) 134 and gate (c_2), if, for all targets (t) 136, a prop_p(t, c_1) can be proven as equivalent to prop_p(t, c_2) without the trace-prefixing entailed by constraint (c_1) 134, then converting design netlist (N) 120 into a modified netlist (N') 154 by labeling gate (c_2) as a constraint 134 instead of (c_1) is a property preserving transformation. If this validation fails (either through refutation or excessive resource requirements), then constraint simplification unit 170 terminates simplification of this constraint 134. Otherwise, the constraint simplification unit 170 iterates simplification of constraints 134 with the resulting simplified constraint 134.

To illustrate operation of the present invention, consider its application on constraint (c) 134 in a hypothetical design netlist 120 containing a j-stage pipeline linked in parallel to an inverted i-stage pipeline, wherein a constraint (c) 134 disallows precisely the input sequences that can allow a variable (t) at the end of the i-stage pipeline to evaluate (t) to 1. If j>i, then (t) can evaluate to 1 as the constraint 134 precludes such paths only at a later time-step. If, on the other hand, j<=i, constraint (c) 134 prevents (t) from ever evaluating to a 1. When constraint simplification unit 170 is applied such a netlist, if j<=i, constraint (c) 134 can be iteratively replaced by its structural preimage 158 until it becomes combinational (a function only of inputs (il)), at which point reparameterization will outright eliminate it through use of elimination unit 150. If j>i, constraint (c) 134 can be simplified by constraint simplification unit 170 shrinking j to i+1, at which point the check based upon the principle (that for, a design netlist (N) 120 with constraint (c_1) 134 and gate (c_2), if, for all targets (t) 136, a prop_p(t, c_1) can be proven as equivalent to prop_p(t, c_2) without the trace-prefixing entailed by constraint (c_1) 134, then converting design netlist (N) 120 into a modified netlist (N') 154 by labeling gate c_2 as a constraint 134 instead of (c_1) is a property preserving transformation) fails, because the target 136 would transition from being hittable to becoming unhittable, causing the iterations by constraint simplification unit 170 to terminate with the corresponding simplified constraint 134.

Additionally, constraint simplification unit 170 performs a simplification to reduce the computational expense inherent in an equality check. For a structural initialization 160 of a gate (u) which has no inputs in its combinational fanin, struct_init(u), is a logic cone obtained by replacing each register 142 gate in the combinational fanin of gate u with its corresponding initial value function from initial states 132. The initial value constraint 134 of (u) is defined as init_cons(u) =init_r OR struct_init(u), where (init_r) is a register 142 whose initial value is ZERO and next-state function is ONE. For a design netlist 120 with constraint (c_1) 134, if, for every target (t) 136 in a design netlist 120, verification toolkit 124 can prove that prop_p(t,c_1) IMPLIES prop_p(t,struct_pre (c_1)) with the trace-prefixing entailed by constraint (c_1) 134, then labeling struct_pre(c_1) and init_cons(c_1) as constraints instead of c_1 is a property-preserving transformation, which provides a "more efficient" way to perform the proof initiated by constraint simplification unit 170. Practically, the trace-prefixing of constraint (c_1) 134 substantially reduces the complexity of the proof initiated by constraint simplification unit 170, e.g., by enabling low cost inductive proofs to be performed by constraint simplification unit 170. This check tends to be significantly easier for constraint simplification unit 170 to perform than the property check itself, as it merely attempts to validate that the modified constraint 134 does not alter the hittability of the target 136 along any trace, independently of whether the target 136 is hittable or not. Additionally note that the register (init_r) 142 can readily be eliminated using retiming, and hence does not constitute a significant verification barrier.

Figure 2:
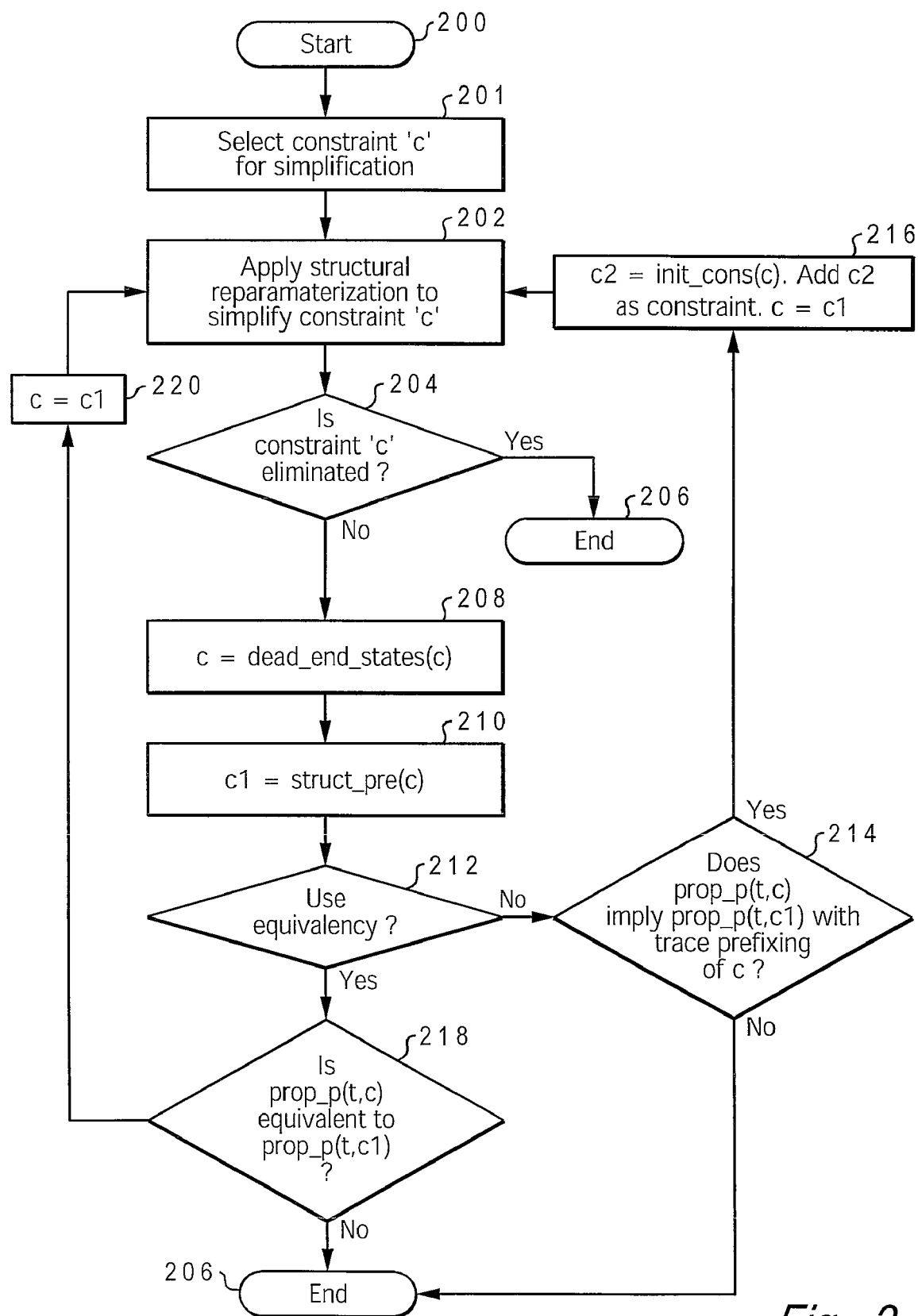
FIG. 2 is a high-level logical flow chart of a process for performing heuristic constraint simplification in accordance with a preferred embodiment of the present invention.

Turning now to FIG. 2, a high-level logical flow chart of a process for performing heuristic constraint 134 simplification in accordance with a preferred embodiment of the present invention is depicted. The process starts at step 200, and then moves to step 201, which illustrates selecting a constraint 134 for simplification. The process then proceeds to step 202. At step 202, elimination unit 150 applies structural reparameterization to simplify the constraint 134 selected in step 201. The process next moves to step 204, which depicts constraint simplification unit 170 determining whether the constraint 134 selected in step 201 was eliminated by the structural reparamaterization performed in step 202. If simplification unit 170 determines that the constraint 134 selected in step 201 was eliminated by the structural reparamaterization performed in step 202, then the process ends at step 206. If, however, simplification unit 170 determines that the constraint 134 selected in step 201 was not eliminated by the structural reparamaterization performed in step 202, then the process proceeds to step 208, which illustrates constraint simplification unit 170 setting the constraint 134 selected in step 201 equal to a dead-end state of the constraint 134 selected in step 201. The process then moves to step 210.

At step 210, constraint simplification unit 170 creates a structural preimage 158 of the constraint 134 selected in step 201. The process next proceeds to step 212, which depicts constraint simplification unit 170 determining whether to use an equivalency method for further simplification operations. If constraint simplification unit 170 determines that an equivalency method is to be used for further simplification operations, then the process next moves to step 214. At step 218, constraint simplification unit 170 determines whether a combination of a target 136 and the dead-end value state generated in step 208 of the constraint 134 selected in step 201 is equal to a combination of the target 136 and the structural preimage 158 of the constraint 134 selected in step 201. That combination is formed by a prop_p(t, c) function using an eliminate_constraint algorithm. If the combination of a target 136 and the dead-end value state generated in step 208 of the constraint 134 selected in step 201 is not equal to a combination of the target 136 and the structural preimage 158 of the constraint 134 selected in step 201, then the process ends at step 206. If the combination of a target 136 and the dead-end value state generated in step 208 of the constraint 134 selected in step 201 is equal to a combination of the target 136 and the structural preimage 158 of the constraint 134 selected in step 201, then the process proceeds to step 220. At step 220, constraint simplification unit 170 sets the constraint 134 selected in step 201 equal to the structural preimage 158 generated in step 208. The process then returns to step 202.

Returning to step 212, if constraint simplification unit 170 determines that an equivalency method is not to be used for further simplification operations, then the process next moves to step 214, which depicts constraint simplification unit 170 determining whether a combination of a target 136 and the dead-end state calculated in step 208 of the constraint 134 selected in step 201 implies a combination of a target 136 and a structural preimage 158 identified in step 210 with trace prefixing. If constraint simplification unit 170 determines that a combination of a target 136 and the dead-end state calculated in step 208 of the constraint 134 selected in step 201 does not imply a combination of a target 136 and a structural preimage 158 identified in step 210 with trace prefixing, then the process ends at step 206. If, however, constraint simplification unit 170 determines that a combination of a target 136 and the dead-end state calculated in step 208 of the constraint 134 selected in step 201 implies a combination of a target 136 and a structural preimage 158 identified in step 210 with trace prefixing, then the process moves to step 216, which depicts constraint simplification unit 170 identifying an initial value of the constraint 134 selected in step 201, creating (through candidate unit 156) a candidate gate as the initial value of the constraint 134 selected in step 201, adding the candidate gate as a second constraint 134, and setting the constraint 134 selected in step 201 to the structural preimage 158 generated in step 208. The process then returns to step 202.

Figure 3:
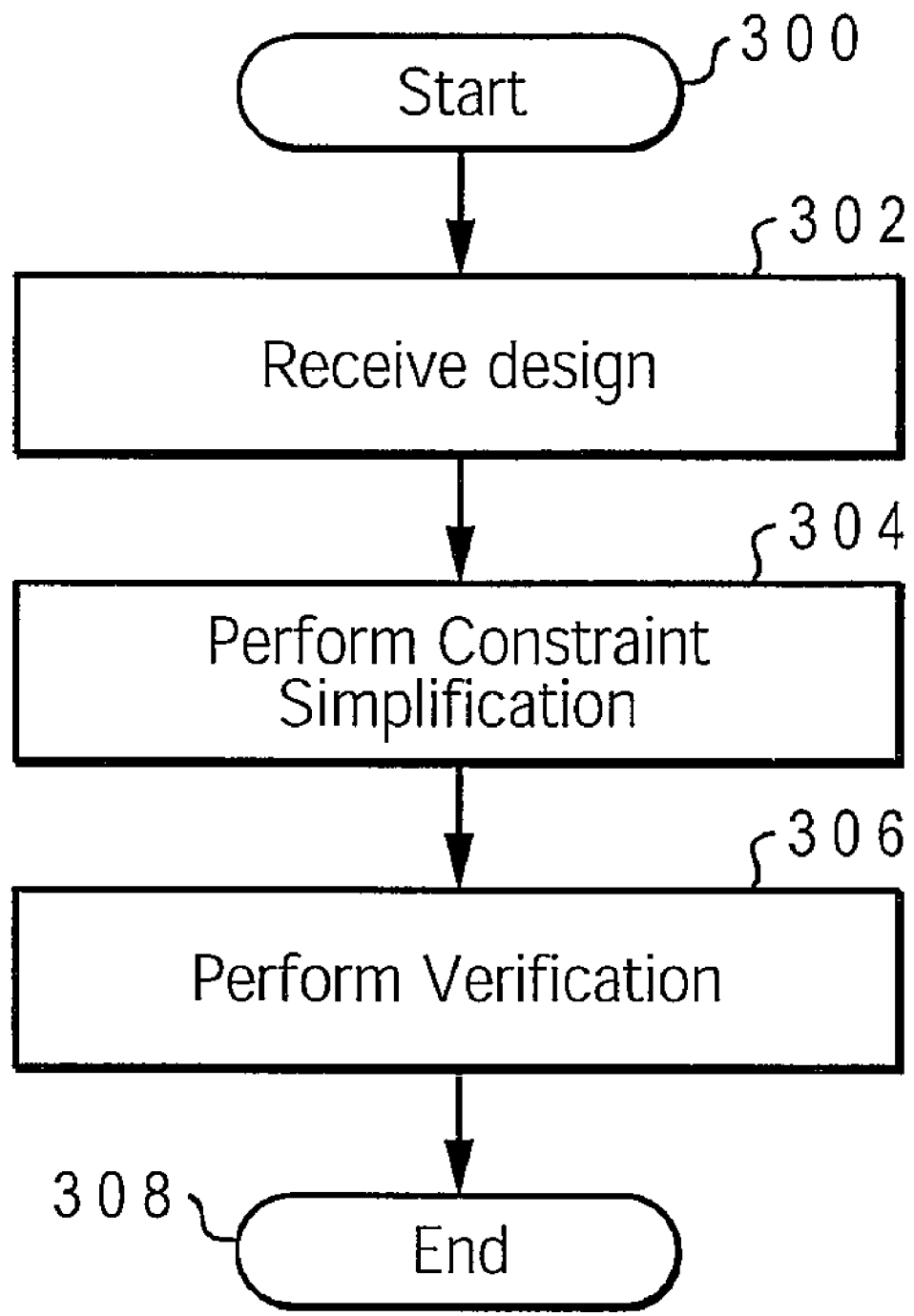
FIG. 3 is a high-level logical flow chart of a process for performing verification of a design in accordance with a preferred embodiment of the present invention.

Referring now to FIG. 3, a high-level logical flow chart of a process for performing verification of a design in accordance with a preferred embodiment of the present invention is illustrated. The process starts at step 300, and then moves to step 302 which depicts verification toolset 124 receiving a design in the form of design netlist 120. The process then proceeds to step 304. At step 304, verification toolset 124 performs constraint 134 simplification according to the method described with respect to FIG. 2. The process next moves to step 306, which illustrates verification toolset 124 performing verification of design netlist 120. The process then ends at step 308.

While the invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

What is claimed is:

1. A machine-usable medium having a plurality of instructions processable by a machine embodied therein, wherein said plurality of instructions, when processed by said machine, causes said machine to perform a computer-verification method comprising:
   selecting a first computer-design constraint for simplification;
   applying structural reparameterization to simplify said first computer-design constraint;
   in response to determining that said first computer-design constraint is not eliminated, setting said first computer-design constraint equal to a dead-end state of said first computer-design constraint;
   creating a structural preimage of said first computer-design constraint; and
   in response to determining that a combination of a target and said dead-end state of said first computer-design constraint is equal to a combination of said target and said structural preimage of said first computer-design constraint, setting said first computer-design constraint equal to said structural preimage.

2. The machine-usable medium of claim 1, wherein said method further comprises a step of, in response to determining that said combination of said target and said dead-end state of said first computer-design constraint implies a combination of said target and said structural preimage with trace prefixing, identifying an initial value of said first computer-design constraint.

3. The machine-usable medium of claim 2, wherein said method further comprises a step of creating a candidate gate as said initial value of said first computer-design constraint.

4. The machine-usable medium of claim 3, wherein said method further comprises a step of adding said candidate gate as a second computer-design constraint.

5. The machine-usable medium of claim 4, wherein said method further comprises a step of setting said first computer-design constraint to said structural preimage of said first computer-design constraint.

6. The machine-usable medium of claim 5, wherein said method further comprises:
   receiving a design for use with said first computer-design constraint; and
   performing verification of said design.

* * * * *